(12) United States Patent
Fischer et al.

(10) Patent No.: US 7,450,382 B1
(45) Date of Patent: Nov. 11, 2008

(54) APPARATUS FOR ENCLOSING ELECTRONIC COMPONENTS

(75) Inventors: Larry G. Fischer, Waseca, MN (US); Michael J. Wayman, Waconia, MN (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 11/748,711

(22) Filed: May 15, 2007

(51) Int. Cl.
H05K 7/20 (2006.01)

(52) U.S. Cl. ................. 361/695; 361/690; 361/694; 361/688; 454/184

(58) Field of Classification Search ......... 361/688–689, 361/690, 695
See application file for complete search history.

(56) References Cited

U.S. PATENT DOCUMENTS

| | | | |
|---|---|---|---|
| 4,656,559 A | 4/1987 | Fathi | |
| 4,962,445 A * | 10/1990 | Pelet et al. | 361/722 |
| 5,065,278 A * | 11/1991 | Schultz | 361/688 |
| 5,089,935 A | 2/1992 | Ito | |
| 5,150,278 A | 9/1992 | Lynes et al. | |
| 5,267,122 A | 11/1993 | Glover et al. | |
| 5,842,514 A | 12/1998 | Zapach et al. | |
| 5,946,193 A * | 8/1999 | Hendrix et al. | 361/704 |
| 6,028,769 A * | 2/2000 | Zurek | 361/704 |
| 6,104,611 A | 8/2000 | Glover et al. | |
| 6,118,662 A * | 9/2000 | Hutchison et al. | 361/704 |
| 6,396,691 B1 * | 5/2002 | Pagnozzi | 361/690 |
| D462,675 S | 9/2002 | Kusz et al. | |
| 6,510,223 B2 | 1/2003 | Laetsch | |
| 6,563,050 B2 | 5/2003 | Gustine et al. | |
| 6,587,339 B1 | 7/2003 | Daniels et al. | |
| 6,603,660 B1 * | 8/2003 | Ehn et al. | 361/694 |
| 6,611,426 B2 * | 8/2003 | Hutchison et al. | 361/690 |
| 6,628,521 B2 | 9/2003 | Gustine et al. | |
| 6,781,830 B2 | 8/2004 | Barth et al. | |
| 6,862,180 B2 | 3/2005 | Sawyer et al. | |
| 6,865,085 B1 | 3/2005 | Ferris et al. | |
| 6,894,907 B2 | 5/2005 | Gustine et al. | |

(Continued)

OTHER PUBLICATIONS

Fox et al., "Star-Structure Optical Local Networks", "British Telecommunications Technology Journal", Apr. 1989, pp. 76-88, vol. 7, No. 2, Publisher: Fulcrum.

*Primary Examiner*—Gregory D Thompson
(74) *Attorney, Agent, or Firm*—Fogg & Powers LLC; Gregory M. Taylor

(57) ABSTRACT

An apparatus for enclosing electronic components comprises a chassis enclosure defining an internal chamber and having an upper portion and a lower portion. The upper portion comprises a first front wall having a length dimension greater than a width dimension, and a first pair of opposing side walls that are each contiguous with the first front wall. The lower portion comprises a second front wall having a length dimension less than the length dimension of the first front wall, and a second pair of opposing side walls that are each contiguous with the second front wall. A plurality of heat sink fins are on each of the first front and side walls, and on each of the second front and side walls. Each of the heat sink fins are configured to be substantially parallel to the length dimension of the first front wall and the second front wall, and extend continuously along each wall. The plurality of heat sink fins has an arcuate-like end view profile on each wall of the chassis enclosure.

27 Claims, 7 Drawing Sheets

U.S. PATENT DOCUMENTS

| | | |
|---|---|---|
| 6,897,377 B2 | 5/2005 | Gustine et al. |
| 6,992,249 B2 | 1/2006 | Gustine et al. |
| 7,075,789 B2 | 7/2006 | Gustine et al. |
| 7,118,697 B2 | 10/2006 | Sawyer et al. |
| 7,245,485 B1 * | 7/2007 | Morrell ...................... 361/687 |
| 7,355,848 B1 * | 4/2008 | Hodge et al. ................ 361/690 |
| 2004/0007348 A1 * | 1/2004 | Stoller ........................ 165/47 |
| 2005/0170681 A1 | 8/2005 | Gustine et al. |
| 2006/0204397 A1 * | 9/2006 | Yoshikawa et al. .......... 420/562 |

* cited by examiner

APPARATUS FOR ENCLOSING ELECTRONIC COMPONENTS

BACKGROUND

Environmentally protected housings are used in a wide variety of applications, including containing and protecting electronic components of the type used for transferring signals over long distances. For example, the telecommunications industry transfers signals over optical fibers. If the signal is transferred over a long distance, the signal may be too weak by the time it reaches its destination to be useful. Consequently, electronic circuit cards are used to detect, clean up, and amplify a weak signal for retransmission through another length of fiber-optic cable. These electronic circuit cards are often deployed in environmentally protected housings located above and below ground.

Increased demand on the telecommunications industry to meet the needs of internet subscribers has resulted in the need to transfer more and stronger electrical signals over greater distances. One way of accomplishing this is to amplify the signals using electronic circuit cards deployed in environmentally protected housings. To meet the need for transferring stronger electrical signals over greater distances, electronic circuit cards having higher amplification capabilities and thus greater heat dissipation rates are typically used. The need for stronger electrical signals may be accommodated by placing as many of these higher-heat-dissipating circuit cards into a single environmentally protected enclosure as possible.

As the level of heat dissipation increases, a mechanism for removing this heat from electronic components in an enclosure is required. One simple cooling method is to force outside air through a filter and over the hot surfaces of the electronics, and then exhaust this heated air out into the environment. This cooling method, however, has some inherent design flaws. First, the filter requires regular maintenance and can become clogged quickly in extreme environmental conditions. Second, if the enclosure is placed below ground, water ingress is a concern, therefore, an enclosure that is completely sealed needs to be used.

SUMMARY

Apparatus for enclosing electronic components such as used in telecommunication systems are disclosed. In one embodiment, such an apparatus comprises a chassis enclosure defining an internal chamber and comprising an upper portion and a lower portion. The upper portion comprises a first front wall having a length dimension greater than a width dimension, and a first pair of opposing side walls that are each contiguous with the first front wall. The lower portion comprises a second front wall having a length dimension less than the length dimension of the first front wall, and a second pair of opposing side walls that are each contiguous with the second front wall. A plurality of heat sink fins are on each of the first front wall and the first pair of opposing side walls. A plurality of heat sink fins are also on each of the second front wall and the second pair of opposing side walls. Each of the heat sink fins are configured to be substantially parallel to the length dimension of the first front wall and the second front wall, and extend continuously along each wall. The plurality of heat sink fins has an arcuate-like end view profile on each wall of the chassis enclosure.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

It should be understood that like reference characters denote like elements throughout the Figures.

DETAILED DESCRIPTION

In the following detailed description, embodiments are described in sufficient detail to enable those skilled in the art to practice the invention. It is to be understood that other embodiments may be utilized without departing from the scope of the present invention. The following description is, therefore, not to be taken in a limiting sense.

Figure 1:
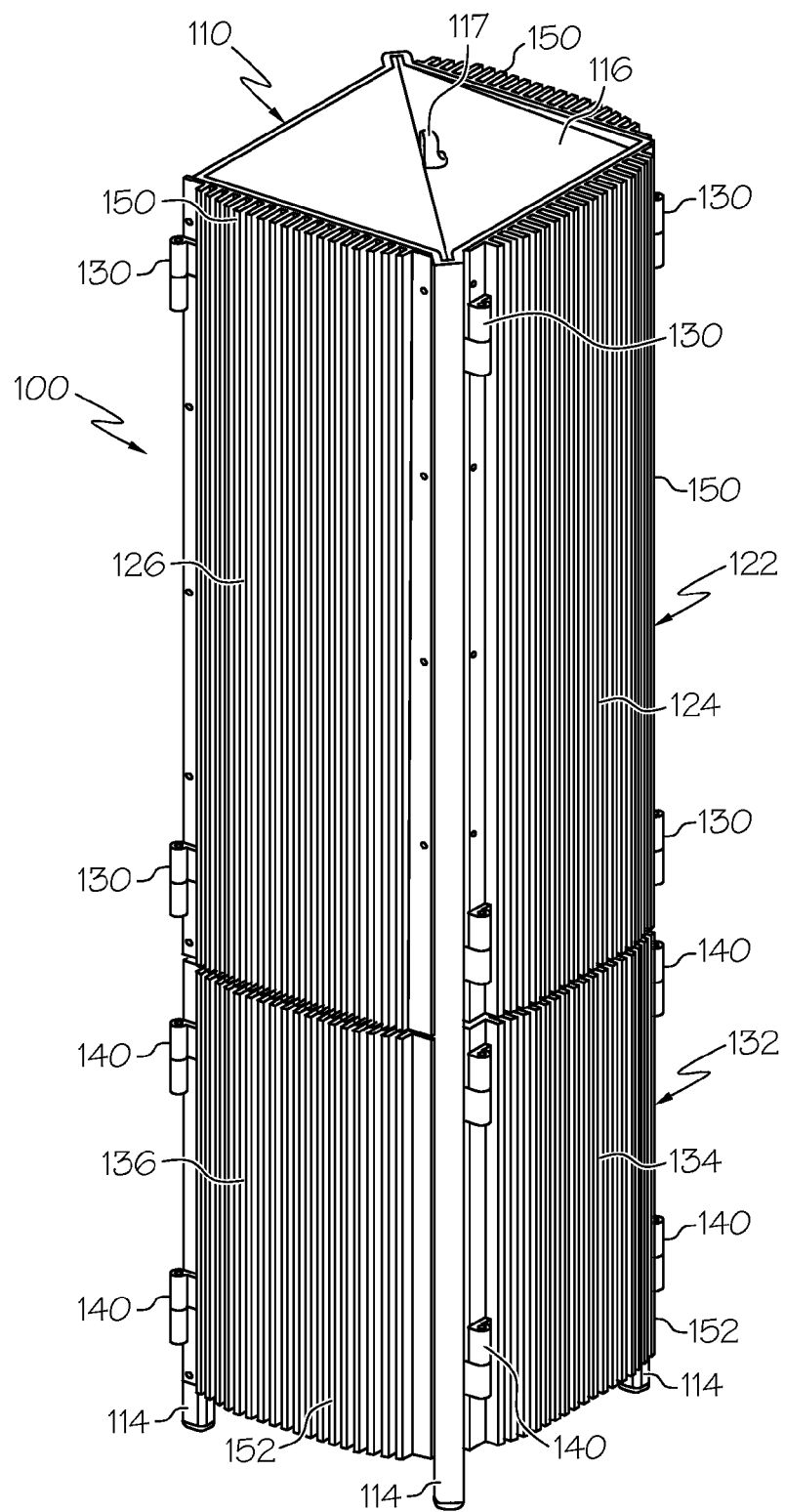
FIG. 1 is an elevated perspective view of an apparatus for enclosing electronic components according to one embodiment of the invention.
Figure 2:
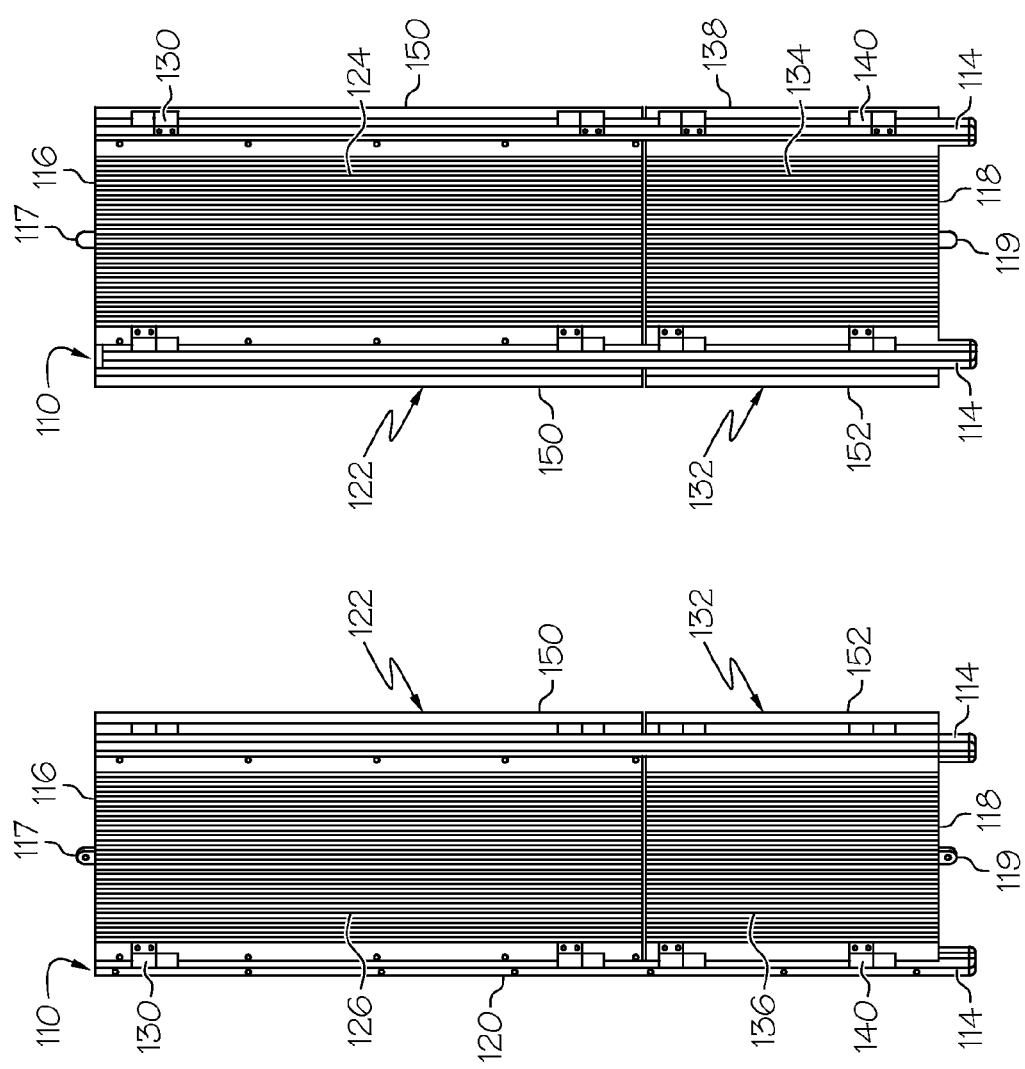
FIG. 2A is a side view of the apparatus shown in FIG. 1.
FIG. 2B is a front view of the apparatus shown in FIG. 1.
FIG. 2C is a top view of the apparatus shown in FIG. 1.

FIG. 1 is a perspective view of one embodiment of an apparatus 100 for enclosing electronic components used in a telecommunication system. Other views of apparatus 100 are shown in FIGS. 2A-2C. The apparatus 100 has a chassis enclosure 110 with an internal chamber. The internal chamber of chassis enclosure 110 is configured to hold various components of a telecommunication system, such as a wideband digital radio, a power amplifier, a radio frequency (RF) transport, a wideband digital transceiver, a power supply, or other electronic components. The enclosure 110 is configured so that one or more telecommunication services can be provided therefrom, such as, for example, 800-A, 800-B, specialized mobile radio (SMR), 1900, 900, and 2100.

The chassis enclosure 110 has a length greater than a width thereof, and has a plurality of legs 114 that support apparatus 100 in an upright position. The legs 114 also protect protruding connectors from damage during shipping or installation. The chassis enclosure 110 can be made of any material having a suitable combination of thermal properties, corrosion resistance, and strength, such as a metallic material. For example, the chassis enclosure 110 can be made from welded sheet metal or cast metal. Suitable exemplary materials for chassis enclosure 110 include aluminum, magnesium, zinc, steel, or combinations thereof.

A divided upper plate 116 covers the top of chassis enclosure 110 and has a lifting attachment point 117 thereon, which provides the ability to use a hoist to position and handle enclosure 110. A lower plate 118 covers the bottom of chassis enclosure 110 and also has an attachment point 119 thereon useful in handling and assembly.

A back cover 120 is attached to the backside of chassis enclosure 110. A series of duplexers or other non-heat generating electronics can be attached to an inner surface of back cover 120 so that the duplexers or other electronics are disposed in the chamber of chassis enclosure 110 when back cover 120 is attached thereto. The back cover 120 can be removably attached to chassis enclosure 110 by conventional fasteners such as bolts, clamps, latches, or other mechanical locking features. The back cover 120 can be formed of cast metal or machined metal, such as aluminum, magnesium, zinc, steel, or combinations thereof.

The chassis enclosure 110 has an upper portion 122 including a first front wall 124 having a length dimension greater than a width dimension. A first pair of opposing side walls 126, 128 are each contiguous with the first front wall 124. The first front wall 124 and first sides walls 126, 128 are movably attached to chassis enclosure 110 by a plurality of hinges 130. This allows the first front and side walls to be easily opened and closed, thereby providing access to the internal chamber of chassis enclosure 110.

The chassis enclosure 110 also has a lower portion 132 that includes a second front wall 134 having a length dimension less than the length dimension of the first front wall 124. A second pair of opposing side walls 136, 138 are each contiguous with the second front wall 134. The second front wall 134 and second sides walls 136, 138 are movably attached to chassis enclosure 110 by a plurality of hinges 140 that allow the second front and side walls to be opened and closed as desired.

A plurality of heat sink fins 150 are disposed on each of first front wall 124 and first side walls 126, 128. A plurality of heat sink fins 152 are also disposed on each of second front wall 134 and second side walls 136, 138. Each of the fins are configured to be substantially parallel with respect to the length dimension of the first and second front walls, and can extend continuously along the length of each wall without a gap. The fins allow apparatus 100 to utilize natural convection cooling, with no fans or heat pipes.

In one embodiment, the plurality of heat sink fins 150, 152 have an arcuate-like end view profile on each wall such as shown in FIGS. 1 and 2C. Thus, fins that are closer to the hinges protrude outwardly from each wall a shorter distance than the fins that are toward a middle portion of the wall. This configuration serves the purpose of maximizing the fin height of the central fins, which are required to dissipate the most heat, and shorten the fins on the edges that dissipate less heat. The substantially arcuate profile of the fins reduces the total cross-section and improves heat dissipation.

The fins can be formed of a cast metal, an extruded metal, or a machined metal, such as aluminum, magnesium, zinc, steel, or combinations thereof. The fins can be attached to the walls of chassis enclosure 110 by welding, latching, bolting, or other means for mechanical clamping.

Figure 3:
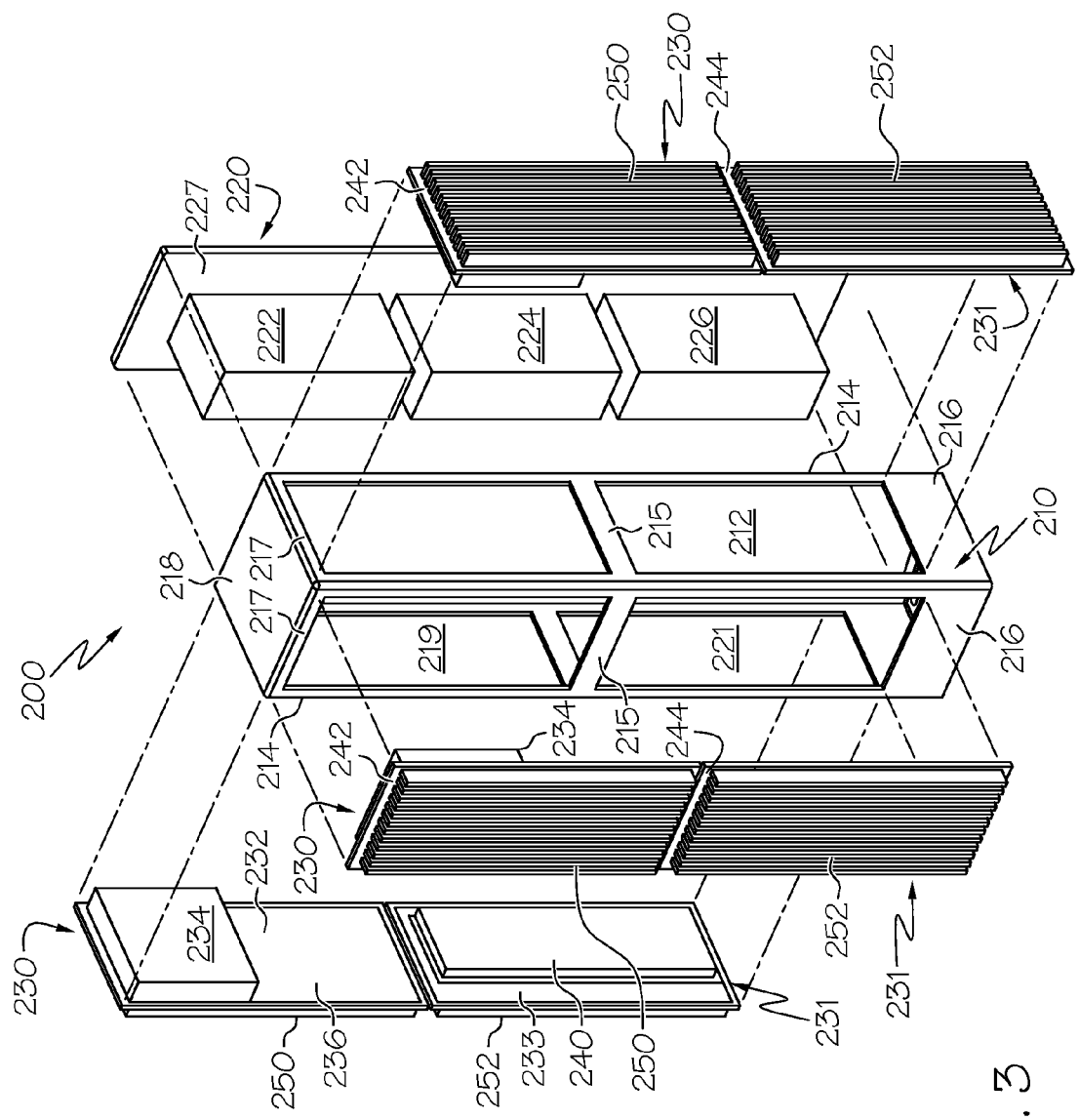
FIG. 3 is an exploded perspective view of an apparatus for enclosing electronic components according to another embodiment of the invention.
Figure 4:
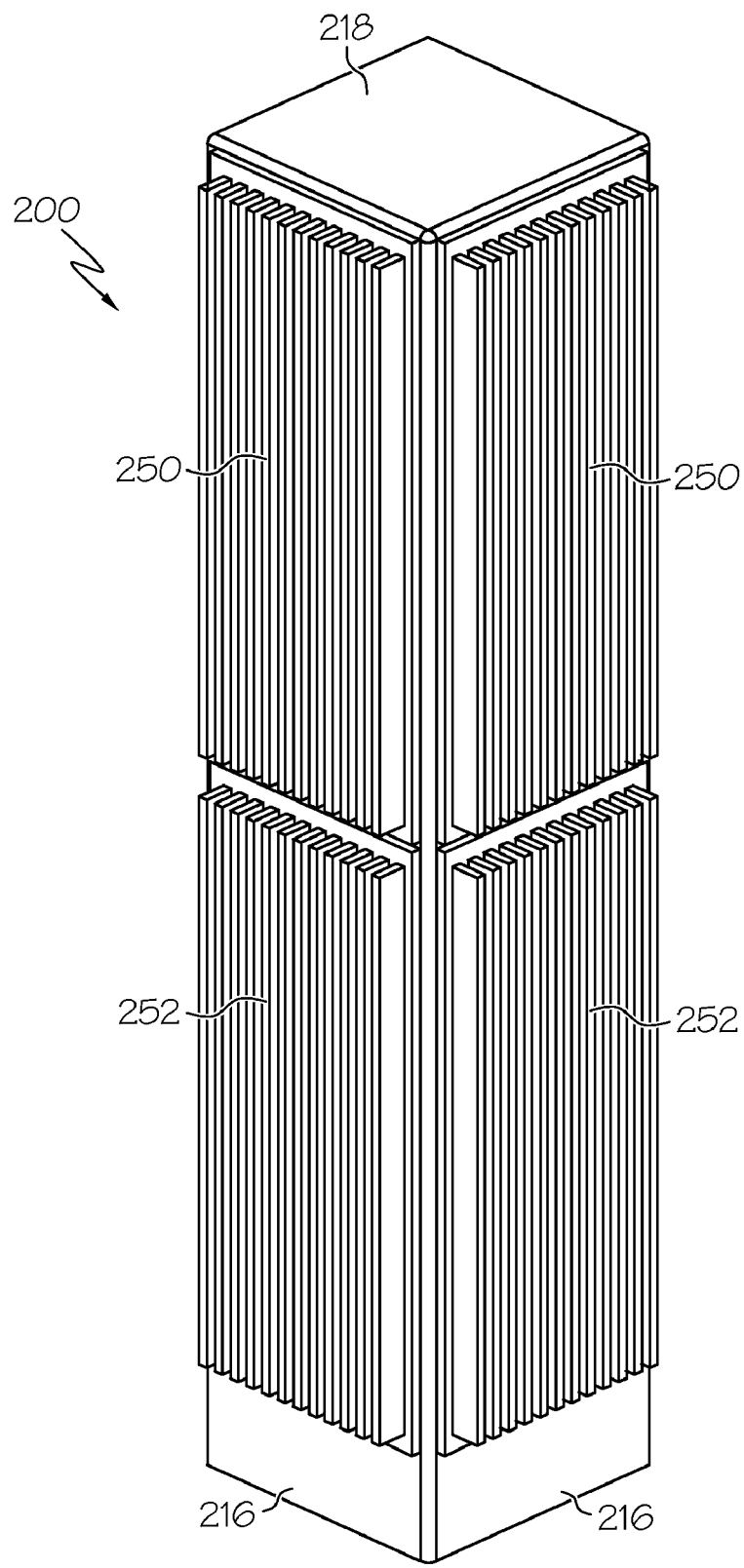
FIG. 4 is an elevated perspective view of the apparatus shown in FIG. 3 in an assembled form.

FIG. 3 is an exploded perspective view of another embodiment of an apparatus 200 for enclosing electronic components used in a telecommunication system. Additional views of apparatus 200 in an assembled form are shown in FIGS. 4 and 5A-5C.

As shown in FIG. 3, apparatus 200 has a chassis enclosure 210 having an open backside that communicates with an internal chamber 212. The chassis enclosure 210 has a length greater than a width thereof. The chassis enclosure 210 has a plurality of elongated legs 214 that are contiguous with a plurality of lateral support members 215, a plurality of base support members 216, and a plurality of top support members 217. The lateral support members 215 are interposed between the base support members 216 and the top support members 217. A top plate 218 is attached to top support members 217.

The legs 214, lateral support members 215, base support members 216, and top support members 217 are configured to define a pair of openings into the chamber at each side of chassis enclosure 210 along the length thereof except for the backside. The chamber is open from the top plate 218 to the base support members 216. The chassis enclosure 210 can be made from welded sheet metal or cast metal, such as aluminum, magnesium, zinc, steel, or combinations thereof.

An elongated mounting plate 220 is configured to be removably attached to the backside of chassis enclosure 210. A series of duplexers 222, 224, and 226 can be attached to an inner surface 227 of mounting plate 220 so that the duplexers are disposed in chamber 212 when mounting plate 220 is attached to chassis enclosure 210. The mounting plate 220 can be removably attached to chassis enclosure 210 by conventional fasteners such as bolts, clamps, or latches. The mounting plate 220 can be formed of cast metal or machined metal, such as aluminum, magnesium, zinc, steel, or combinations thereof.

A plurality of rectangular upper panels 230 are configured to be removably attached to legs 214, lateral support members 215, and top support members 217 in order to cover corresponding upper openings 219 of the pair of openings along each side. Likewise, a plurality of rectangular lower panels 231 are configured to be removably attached to elongated legs 214, lateral support members 215, and base support members 216 in order to cover corresponding lower openings 221 of the pair of openings along each side. The upper and lower panels can be attached to the various portions of chassis enclosure 210 by conventional fasteners such as bolts, clamps or latches.

An inner surface 232 of upper panels 230 is configured to hold a linear power amplifier (LPA) 234 and has a power supply area 236. An inner surface 233 of lower panels 231 is configured to hold a printed circuit board (PCB) assembly 240. The apparatus 200 is capable of supporting up to three telecommunication bands, with separate access for each band. Clearance is also provided in apparatus 200 for each band to have its own power supply. In an alternative embodiment, separate access is provided for each band, but with the PCB assembly, LPA, and power supply mounted to a single heat sink to reduce the number of openings.

In another alternative embodiment, custom LPA and duplexer designs can be employed to allow the size of apparatus 200 to be reduced. This embodiment also allows for increased LPA cooling by sinking the LPA to the duplexer which is used as a heat sink.

Figure 5C:
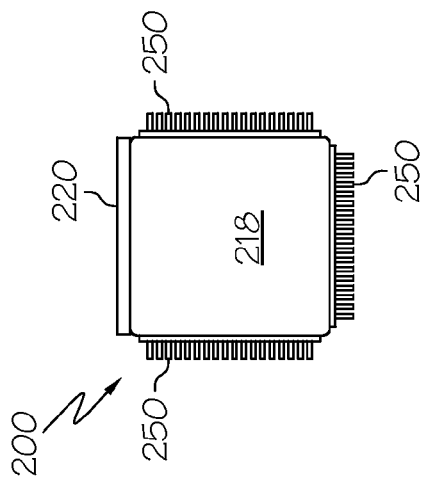
FIG. 5C is a top view of the apparatus shown in FIG. 4.
Figure 5B:
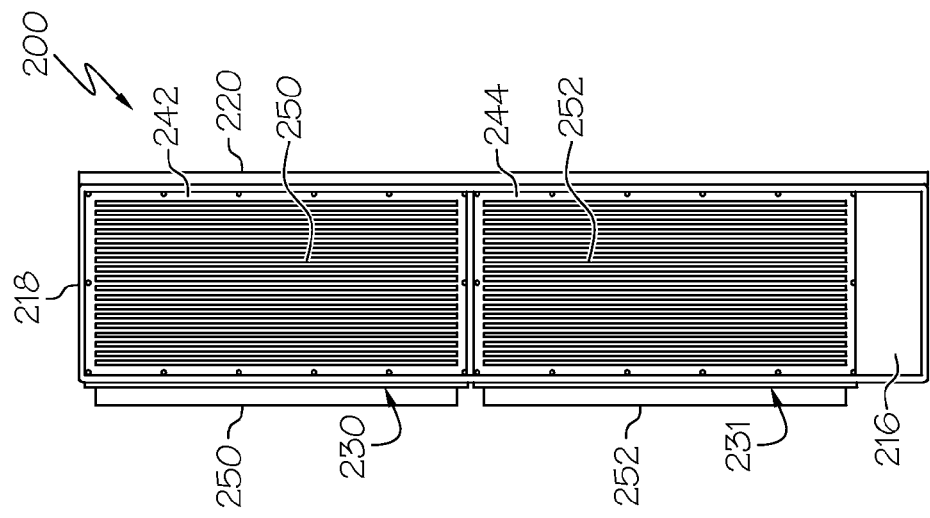
FIG. 5B is a side view of the apparatus shown in FIG. 4.
Figure 5A:
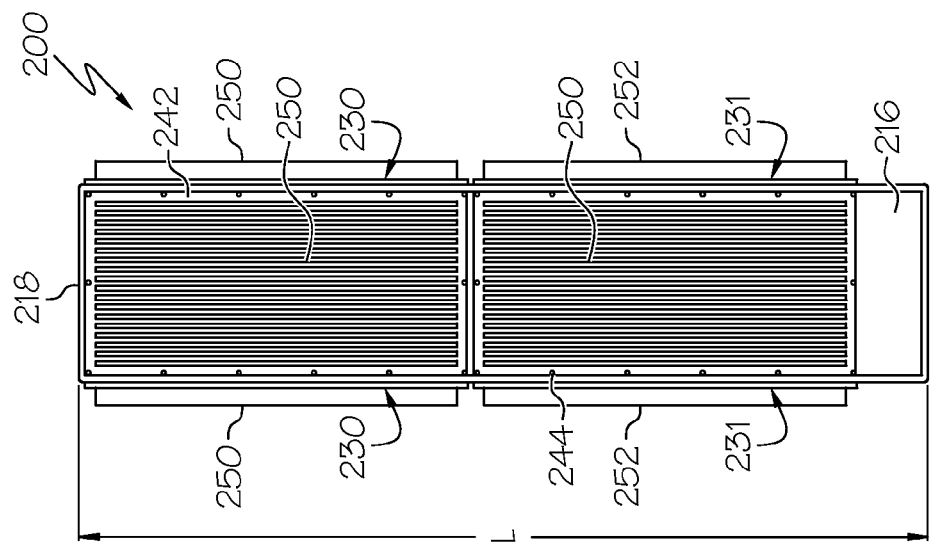
FIG. 5A is a front view of the apparatus shown in FIG. 4.

The apparatus 200 utilizes natural convection cooling, with no fans or heat pipes. Accordingly, an outer surface 242 of each of upper panels 230 has a plurality of heat sink fins 250 thereon. Likewise, an outer surface 244 of each of lower panels 231 has a plurality of heat sink fins 252 thereon. The heat sink fins 250, 252 can be positioned to be substantially parallel with respect to a length dimension L of apparatus 200 such as shown in FIG. 5A. Each of heat sink fins 250, 252 can also extend continuously along each panel without a gap.

The heat sink fins 250, 252 can be formed of a cast metal, an extruded metal, or a machined metal, such as aluminum, magnesium, zinc, steel, or combinations thereof. The heat sink fins can be attached to the upper and lower panels by welding, bolting, latching, or other means of mechanical clamping.

The apparatus 200 can be mounted on a pole inside or outside. The apparatus 200 can also be mounted on a wall, a vault, or a strand such as a cable strand.

Figure 7:
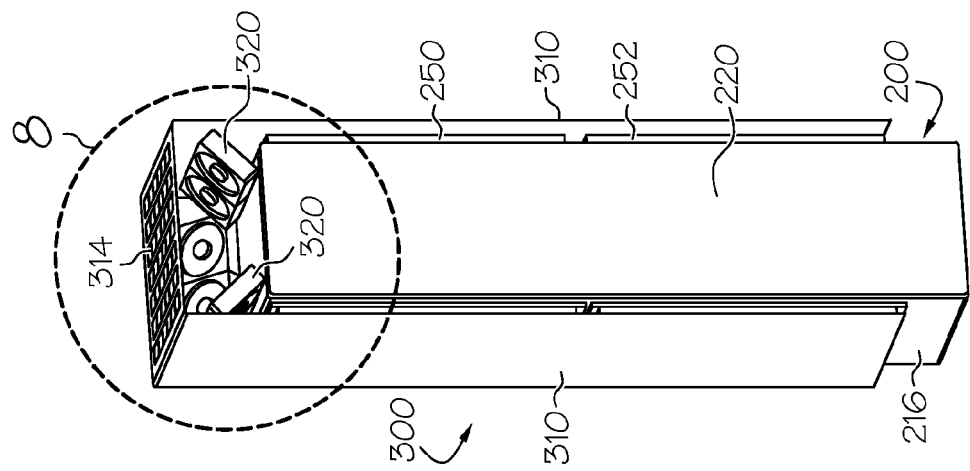
FIG. 7 is a rear perspective view of the apparatus shown in FIG. 6.
Figure 6:
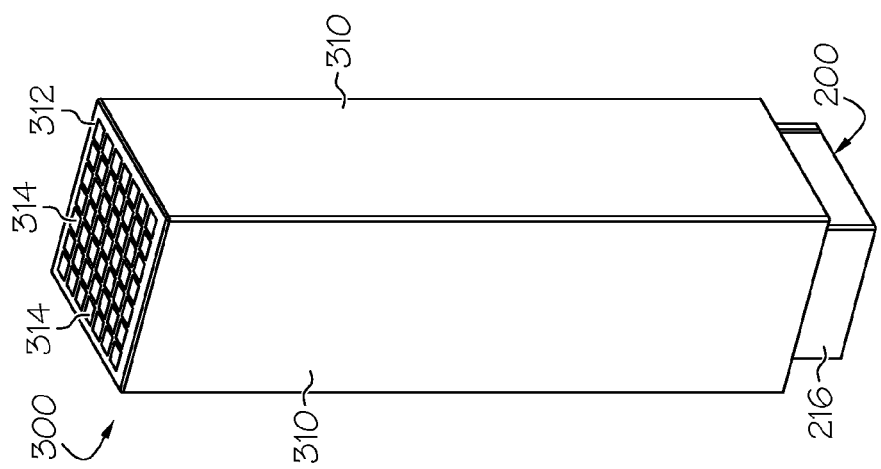
FIG. 6 is an elevated perspective view of the apparatus of FIG. 4 shown with an optional shroud according to a further embodiment of the invention.

In a further embodiment depicted in FIGS. 6 and 7, an optional shroud 300 can be placed around apparatus 200 to provide a solar shield. The shroud 300 has elongated rectangular side panels 310 that cover heat sink fins 250, 252 on apparatus 200. The shroud 300 also has a vented top cover 312 with a plurality of apertures 314 to provide for escape of exhaust air. The shroud 300 can be formed of a sheet metal or machined metal, such as aluminum, magnesium, zinc, steel, or combinations thereof.

Figure 8:
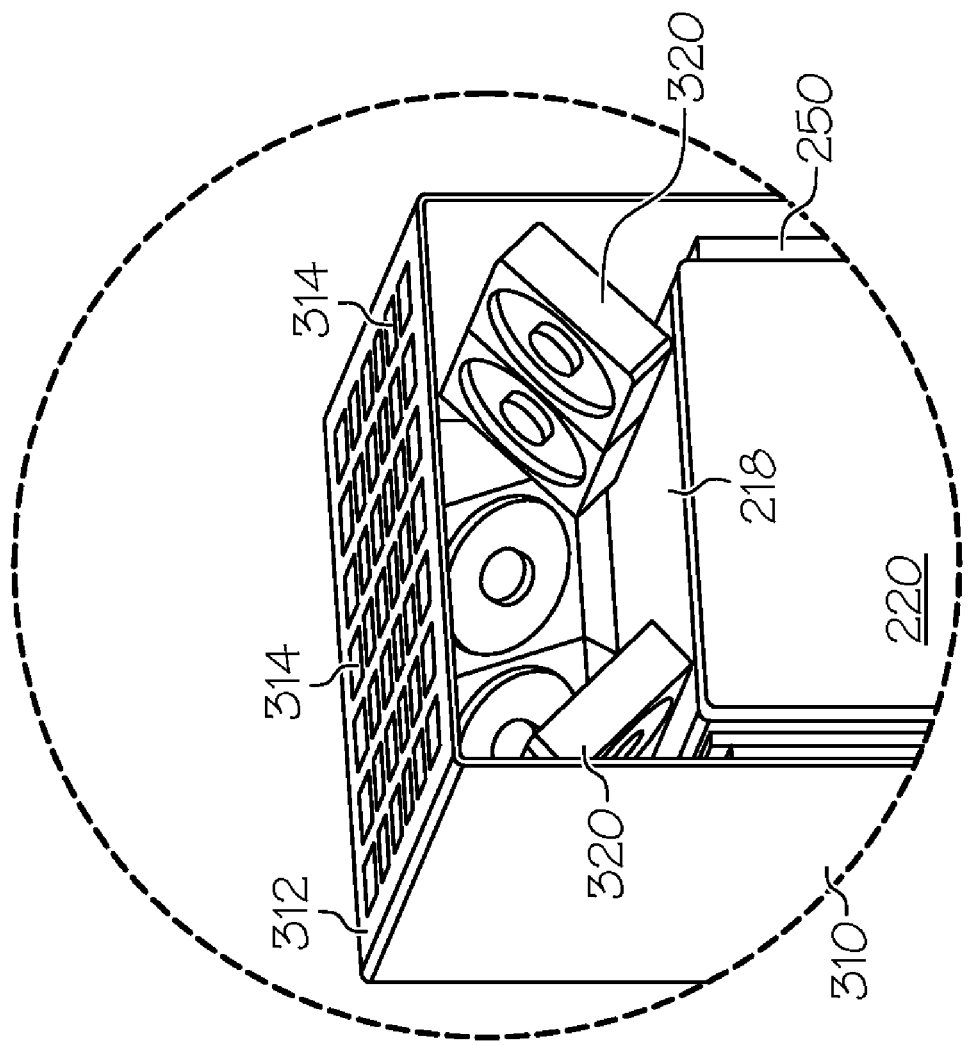
FIG. 8 is an enlarged sectional view of the apparatus shown in FIG. 7.

As shown in FIGS. 7 and 8, a plurality of fans 320, such as an outdoor rated fan array, can be disposed in a compartment of shroud 300 below vented top cover 312 and over top plate 218. The fans provide assisted forced convection cooling for extreme environments. During fan operation, air is drawn up through openings between side panels 310 and heat sink fins 252 adjacent to base support members 216 to provide for increased cooling. The exhaust air exits through vented top cover 312. The fans act to increase the air velocity over heat sink fins 250, 252 by reducing the pressure at the top of the air column. The resulting increased volumetric air flow increases the amount of heat dissipation while still allowing the electronics to remain sealed within the enclosure.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. An apparatus for enclosing electronic components, comprising:
    a chassis enclosure defining an internal chamber and comprising:
        an upper portion comprising:
            a first front wall having a length dimension greater than a width dimension;
            a first pair of opposing side walls that are each contiguous with the first front wall; and
        a lower portion comprising:
            a second front wall having a length dimension less than the length dimension of the first front wall; and
            a second pair of opposing side walls that are each contiguous with the second front wall;
    a plurality of heat sink fins on each of the first front wall and the first pair of opposing side walls;
    a plurality of heat sink fins on each of the second front wall and the second pair of opposing side walls;
    wherein each of the heat sink fins are configured to be substantially parallel to the length dimension of the first front wall and the second front wall, and extend continuously along each wall; and
    wherein the plurality of heat sink fins have an arcuate-like end view profile on each wall of the chassis enclosure.

2. The apparatus of claim 1, further comprising a plurality of legs that support the chassis enclosure in an upright position.

3. The apparatus of claim 1, further comprising a cover attached to a backside of the chassis enclosure.

4. The apparatus of claim 1, wherein the internal chamber is configured to contain one or more components of a telecommunication system.

5. The apparatus of claim 1, wherein the first front and side walls are movably attached to the chassis enclosure by a plurality of hinges, and the second front and side walls are movably attached to the chassis enclosure by a plurality of hinges.

6. The apparatus of claim 5, wherein heat sink fins that are closer to the hinges protrude outwardly from each wall a shorter distance than the heat sink fins that are toward a middle portion of each wall.

7. The apparatus of claim 1, wherein the heat sink fins comprise a cast metal, an extruded metal, or a machined metal.

8. The apparatus of claim 1, wherein the heat sink fins comprise aluminum, magnesium, zinc, steel, or combinations thereof.

9. The apparatus of claim 1, further comprising a divided upper plate covering a top of the chassis enclosure.

10. The apparatus of claim 9, further comprising a lower plate covering a bottom of the chassis enclosure.

11. The apparatus of claim 1, wherein the chassis enclosure is comprised of a metallic material.

12. The apparatus of claim 1, wherein the chassis enclosure comprises aluminum, magnesium, zinc, steel, or combinations thereof.

13. An apparatus for enclosing electronic components, comprising:
    a chassis enclosure defining an internal chamber and having an open backside that communicates with the chamber, the chassis enclosure having a length dimension greater than a width dimension thereof and comprising:
        a plurality of legs;
        a plurality of base support members contiguous with the legs;
        a plurality of top support members contiguous with the legs;
        a plurality of lateral support members contiguous with the legs and interposed between the base support members and the top support members; and
        a top plate attached to the top support members;
        wherein the legs, the base support members, the top support members, and the lateral support members define a pair of openings into the chamber along each side of the chassis enclosure along the length thereof except the backside, with the chamber being open from the top plate to the base support members;
    a mounting plate removably attached to the backside of the chassis enclosure;
    a plurality of upper panels each removably attached to the chassis enclosure over a corresponding opening of the pair of openings along each side;
    a plurality of lower panels each removably attached to the chassis enclosure over a corresponding other opening of the pair of openings along each side;
    a plurality of heat sink fins on an outer surface of each of the upper panels; and
    a plurality of heat sink fins on an outer surface of each of the lower panels.

14. The apparatus of claim 13, further comprising one or more duplexers attached to an inner surface of the mounting plate so that the duplexers are disposed in the chamber when the mounting plate is removably attached to the chassis enclosure.

15. The apparatus of claim 13, further comprising a plurality of linear power amplifiers each connected to an inner surface of a different one of the upper panels.

16. The apparatus of claim 15, wherein the inner surface of each of the upper panels includes a power supply area.

17. The apparatus of claim 13, further comprising a plurality of printed circuit board assemblies each connected to an inner surface of a different one of the lower panels.

18. The apparatus of claim 13, wherein each of the heat sink fins is configured to be substantially parallel to the length dimension of the chassis enclosure, and extend continuously along each panel.

19. The apparatus of claim 13, wherein the heat sink fins comprise a cast metal, an extruded metal, or a machined metal.

20. The apparatus of claim 13, wherein the heat sink fins comprise aluminum, magnesium, zinc, steel, or combinations thereof.

21. The apparatus of claim 13, further comprising a shroud placed thereon.

22. The apparatus of claim 21, wherein the shroud comprises a plurality of side panels that cover the heat sink fins on the upper and lower panels.

23. The apparatus of claim 22, wherein the shroud comprises a vented top cover with a plurality of apertures to provide for escape of exhaust air.

24. The apparatus of claim 23, further comprising a plurality of fans disposed in a compartment of the shroud below the vented top cover and over the top plate.

25. The apparatus of claim 24, wherein the fans comprise an outdoor rated fan array.

26. The apparatus of claim 13, wherein the chassis enclosure is comprised of a metallic material.

27. The apparatus of claim 13, wherein the chassis enclosure comprises aluminum, magnesium, zinc, steel, or combinations thereof.

* * * * *